United States Patent

Martin et al.

[11] Patent Number: 5,101,032
[45] Date of Patent: Mar. 31, 1992

[54] CYCLOALKYLIDENE DYES

[75] Inventors: Hans-Dieter Martin, Wuerzburg; Bernhard Albert, Maxdorf; Knut Kessel, Ratingen, all of Fed. Rep. of Germany

[73] Assignee: BASF Aktiengesellschaft, Ludwigshafen, Fed. Rep. of Germany

[21] Appl. No.: 600,815

[22] Filed: Oct. 22, 1990

[30] Foreign Application Priority Data

Nov. 2, 1989 [DE] Fed. Rep. of Germany ....... 3936538

[51] Int. Cl.$^5$ ................ C07D 487/00; C07D 487/02; C07D 498/02
[52] U.S. Cl. ................................. 544/344; 544/34; 544/101; 544/111; 544/251; 544/250; 544/345; 544/357; 546/81; 546/84; 546/186; 548/518; 556/443; 564/337; 564/384; 564/461; 564/462
[58] Field of Search ............... 544/34, 101, 111, 251, 544/250, 344–345, 357; 546/186, 81, 84; 548/518; 564/337, 384, 461, 462; 556/443

[56] References Cited

PUBLICATIONS

Helvetica Chimica Acta, Band 64, Fasc. 8, Nr. 270, 1981, Seiten 2665–2680, Verlag Helvetica Chimica Acta, Basel, CH; D. Schelz: "Kreuzkonjugierte Cyanine und Merocyanine aus Salzen 1-substituierter 2,3-Dimethylchinoxaline".

Helvetica Chimica Acta—vol. 64, Fasc. 8 (1981)—Nr. 270, "Cross-conjugated Cyanines and Metrocyanines, Obtained from Salts of 1-Substituted 2,3-Dimethylquimoxalines."

*Primary Examiner*—Cecilia Shen
*Attorney, Agent, or Firm*—Oblon, Spivak, McClelland, Maier & Neustadt

[57] ABSTRACT

Cycloalkylidene dyes have the formula

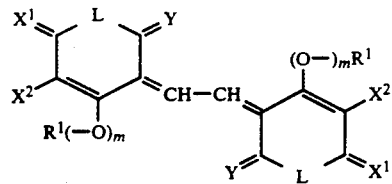

where
m is 0 or 1,
L is a chemical bond or $C_1$–$C_2$-alkylene, which may be substituted,
$R^1$ is hydrogen, $C_1$–$C_{20}$-alkyl, which may be phenyl-substituted, substituted or unsubstituted phenyl, naphthyl or $C_3$–$C_7$-cycloalkyl,
Y is oxygen or two hydrogens,
$X^1$ is oxygen and
$X^2$ is $C_1$–$C_8$-alkanoyloxy, substituted or unsubstituted benzoyloxy, $C_1$–$C_6$-trialkylsilyloxy or a radical of the formula $OR^1$ or $NR^2R^3$, where $R^1$ is as defined above and $R^2$ and $R^3$ are identical or different and each is independently of the other $C_1$–$C_{20}$-alkyl, which may be phenyl-substituted, substituted or unsubstituted phenyl, naphthyl, or $C_3$–$C_7$-cycloalkyl or $R^2$ and $R^3$ together with the nitrogen atom joining them are saturated heterocyclyl, or else one of $R^2$ and $R^3$ is hydrogen, or $X^1$ and $X^2$ together are a radical of the formula

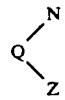

where
Z is oxygen, sulfur or $NR^2$, where $R^2$ is as defined above, and
Q is a carbocyclic or heterocyclic ring in which the substituents N and Z occupy adjacent positions.

4 Claims, No Drawings

CYCLOALKYLIDENE DYES

The present invention relates to cycloalkylidene dyes of the formula I

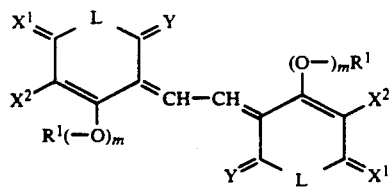

where m is 0 or 1,

L is a chemical bond or $C_1$-$C_2$C-alkylene, which may be monosubstituted or disubstituted by $C_1$-$C_4$-alkyl, R is hydrogen, $C_1$-$C_{20}$-alkyl, which may be phenyl-substituted, substituted or unsubstituted phenyl, naphthyl or $C_3$-$C_7$-cycloalkyl, Y is oxygen or two hydrogens, $X^1$ is oxygen and $X^2$ is $C_1$-$C_8$-alkanoyloxy, substituted or unsubstituted benzoyloxy, $C_1$-$C_6$-trialkylsilyloxy or a radical of the formula OR or $NR^2R^3$, where $R^1$ is as defined above and $R^2$ and $R^3$ are identical or different and each is independently of the other $C_1$-$C_{20}$-alkyl, which may be phenyl-substituted, substituted or unsubstituted phenyl, naphthyl, or $C_3$-$C_7$-cycloalkyl or $R^2$ and $R^3$ together with the nitrogen atom joining them are 5- or 6-membered saturated heterocyclyl which may contain further hetero atoms, or else one of $R^2$ and $R^3$ is hydrogen, or $X^1$ and $X^2$ together are a radical of the formula

where

Z is oxygen, sulfur or $N^2$, where $R^2$ is as defined above, and

Q is a 5- or 6-membered saturated or aromatic, carbocyclic or heterocyclic ring in which the substituents N and Z occupy adjacent positions.

Helv. Chim. Acta 64 (1981), 2665-80, discloses compounds derived from quinoxaline and doubled via the heterocyclic ring.

It is an object of the present invention to provide new cycloalkylidene dyes which should be simple to prepare and have advantageous application properties.

We have found that this object is achieved by the cycloalkylidene dyes of the formula I defined at the beginning.

Any alkyl appearing in the abovementioned formula I may be either straight-chain or branched.

Any substituted phenyl appearing in the abovementioned formula I may have as substituents for example $C_1$-$C_4$-alkyl, $C_1$-$C_4$-alkoxy or halogen.

L is for example methylene, ethylene, ethylidene, 1-propylidene, 2-propylidene, 1,2-propylene, 1,2-butylene, 2,3-butylene, 3-pentylidene or 3,4-hexylene.

$R^1$, $R^2$ and $R^3$ are each for example methyl, ethyl, propyl, isoproyl, butyl, isobutyl, sec-butyl, pentyl, isopentyl, neopentyl, tert-pentyl, hexyl, 2-methylpentyl, heptyl, octyl, 2-ethylhexyl, nonyl, decyl, undecyl, dodecyl, tridecyl, tetradecyl, pentadecyl, hexadecyl, heptadecyl, octadecyl, nonadecyl, eicosyl, benzyl, 1- or 2-phenylethyl, phenyl, 2-, 3- or 4-methylphenyl, 2,4-dimethylphenyl, 2-, 3- or 4-methoxyphenyl, 2,4-dimethoxyphenyl, 2-, 3- or 4-chlorophenyl, 2,6-dichlorophenyl, 2-, 3- or 4-bromophenyl, 1-naphthyl, 2-naphthyl, cyclopropyl, cyclobutyl, cyclopentyl, cyclohexyl or cycloheptyl.

Any 5- or 6-membered saturated heterocyclyl formed by $R^2$ and $R^3$ together with the nitrogen atom joining them together can be for example pyrrolidino, piperidino, morpholino, piperazino or N-($C_1$-$C_4$-alkyl)-piperazino.

$X^2$ is for example formyloxy, acetyloxy, propionyloxy, butyryloxy, isobutyryloxy, pentanoyloxy, hexanoyloxy, heptanoyloxy, octanoyloxy, 2-ethylhexanoyloxy, benzoyloxy, 2-methylbenzoyloxy, 2-methoxybenzoyloxy, 2-chlorobenzoyloxy, trimethylsilyloxy, triethylsilyloxy, tripropylsilyloxy, triisopropylsilyloxy, tributylsilyloxy, tripentylsilyloxy or trihexylsilyloxy.

When $X^1$ and $X^2$ are combined to form a radical of the formula

it can be for example

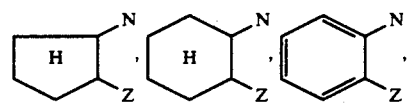

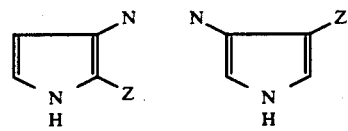

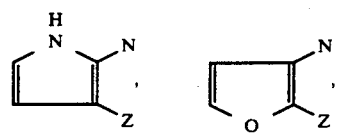

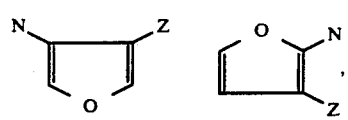

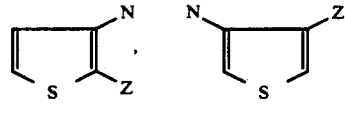

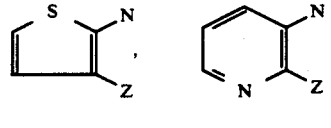

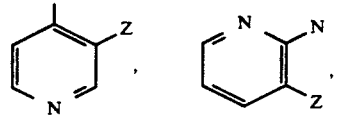

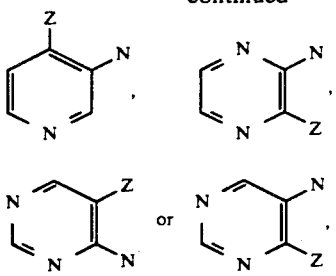

which ring systems may each additionally be monosubstituted or polysubstituted by $C_1-C_{10}$-alkyl, $C_1-C_{10}$-alkoxy, nitro, amino, $C_1-C_4$-monoalkylamino, $C_1-C_4$-dialkylamino, pyrrolidino, piperidino, morpholino, piperazino, N-($C_1-C_4$-alkyl)piperazino or halogen.

Preference is given to cycloalkylidene dyes of the formula I where L is a chemical bond or 2-propylidene.

Particular preference is given to cycloalkylidene dyes of the formula II

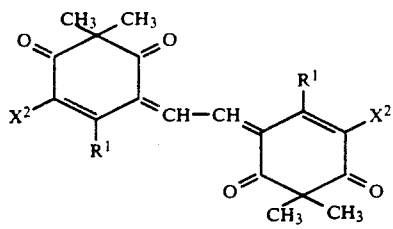

where
  $R^1$ is hydrogen, $C_1-C_{10}$-alkyl, which may be phenyl-substituted, phenyl or naphthyl, and
  $X^2$ is as defined above.

Particular preference is further given to cycloalkylidene dyes of the formula III

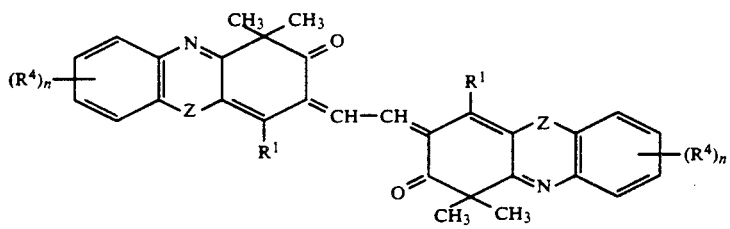

where
  n is 1, 2, 3 or 4,
  $R^1$ is hydrogen, $C_1-C_{10}$-alkyl, which may be phenyl-substituted, phenyl or naphthyl,
  $R^4$ is $C_1-C_{10}$-alkyl, $C_1-C_{10}$-alkoxy, nitro, amino, $C_1-C_4$-monoalkylamino, $C_1-C_4$-dialkylamino, pyrrolidino, piperidino, morpholino, piperazino, N-($C_1-C_4$-alkyl)piperazino, or halogen, and
  Z is as defined above.

Very particular preference is given to cycloalkylidene dyes of formula I, II or III where $R^1$ is hydrogen and, in the formula I, m is 0.

Very particular preference is further given to cycloalkylidene dyes of the formula I or II where $X^2$ is hydroxyl, $C_1-C_8$-alkoxy, $C_2-C_4$-alkanoyloxy, benzoyloxy, trimethylsilyloxy, $C_1-C_8$-monoalkylamino, cyclopropylamino, cyclopentylamino, cyclohexylamino, benzylamino, phenylethylamino, phenylamino, 2-, 3- or 4-methylphenylamino, 1-naphthylamino or 2-naphthylamino.

Very particular preference is further given to cycloalkylidene dyes of the formula III where
  Z is $C_1-C_8$-alkylimino, cyclopropylimino, cyclopentylimino, cyclohexylimino, benzylimino, phenylethylimino, phenylimino, 2-, 3- or 4-methylphenylimino, 1-naphthylimino or 2-naphthylimino.

The novel cycloalkylidene dyes of the formula I can be obtained for example by treating the methyl compounds of the formula IV

where
  m, L and $R^1$ are each as defined above, first with aqueous acids within the range from 20° C. to the boiling point of the reaction mixture and then, following intermediary isolation, with compounds of the formula V $$X^3-Hal \qquad (V)$$

where
  $X^3$ is $C_1-C_8$-alkanoyl, substituted or unsubstituted benzoyl or $C_1-C_6$-trialkylsilyl, and
  Hal is halogen.

Instead of the carbonyl halides it is also possible to use the corresponding anhydrides.

Suitable aqueous acids are for example aqueous mineral acids and aqueous organic acids, such as hydrochloric acid, aqueous sulfuric acid, aqueous p-toluenesulfonic acid, aqueous trifluoroacetic acid, aqueous formic acid or aqueous oxalic acid. The water content of these acids is in general within the range from 5 to 95% by weight.

Following a reaction time which in general varies from 0.5 to 24 hours, the reaction mixture is worked up in a conventional manner (for example by filtration, possibly after concentration or dilution of the reaction mixture with water).

The acylation or silylation is carried out in a conventional manner. The resulting cycloalkylidene dyes I can be purified by crystallization or by means of chromatographic methods.

Those cycloalkylidene dyes of the formula I where $X^2$ is $NR^2R^3$ can be obtained with advantage by reacting the methyl compound IV with amines of the formula VI

$$\text{NH} \begin{matrix} R^2 \\ \\ R^3 \end{matrix} \quad \text{(VI)}$$

where $R^2$ and $R^3$ are each as defined above.

The reaction is advantageously carried out in organic acids, for example formic acid, acetic acid, trifluoroacetic acid, p-toluenesulfonic acid or methanesulfonic acid, in the presence or absence of diluents, such as water, dioxane, tetrahydrofuran or lower alcohols.

The temperature is in general within the range from 20° C. to the boiling point of the reaction mixture.

Methyl compound IV and amine VI are customarily used in a molar ratio of from 3:1 to 1:3.

Following a reaction time which in general varies from 0.5 to 24 hours, the reaction mixture is worked up as described above.

The dyes according to the present invention act as sensitizers for initiating photopolymerizations or as sensitizers in electrophotographic copy layers.

In the presence of oxygen they are capable of forming singlet oxygen on irradiation and therefore they are also suitable for the photodynamic treatment of tumors.

The Examples which follow further illustrate the present invention.

EXAMPLE 1

2,6,6-Trimethylcyclohex-2-ene-1,4-dione

A 1-1 three-neck flask equipped with a gas inlet frit, a stirrer and an intensive condenser was charged with 350 ml of toluene, 350 g of isophorone, 11.4 g of $H_3[P(Mo_3O_{10})_4] \times H_2O$, 1.4 g of $CuSO_4 \cdot 5H_2O$ and 1.4 g of $MoO_3$. After compressed air had been passed through at 110° C. for 90 hours, the reaction mixture was added a little at a time at 80° C. into 4 l of boiling n-hexane. The mixture was then filtered, and the filtrate was concentrated in a rotary evaporator. The yellowish oil obtained by distillation at 97° C./13 mbar was converted into almost colorless crystals at $-18°$ C. by addition of 10% by volume of n-hexane.

Yield: 183.8 g (47% of theory).

EXAMPLE 2

3,3,5-Trimethylcyclohex-5-ene-1,2,4-trione 129.4 g of 2,6,6-trimethylcyclohex-2-ene-1,4-dione (from Example 1) were added to a solution of 100 g of selenium dioxide in a mixture of 800 ml of dioxane and 50 ml of water, and the mixture was refluxed for 9 hours with stirring. The precipitate of elemental selenium was then filtered off with suction, and then all the low boilers were removed in a rotary evaporator. The residue was distilled at 125° C./20 mbar. The distillate was melted, mortared with n-hexane and then extracted with 600 ml of n-hexane. The target product crystallized out in the form of yellow needles.

Yield: 97.9 g (69% of theory); melting point: 88° C.

EXAMPLE 3

Bis(3-hydroxy-5,5-dimethyl-4,6-dioxocyclohex-2-enylidene)ethane

In a 2-1 three-neck flask equipped with an intensive condenser and a stirrer, 50 g of 3,3,5-trimethylcyclohex-5-ene-1,2,4-trione (from Example 2) were dissolved in 300 ml of concentrated hydrochloric acid at room temperature. The flask was then dipped into a hot oil bath at 100° C. for 15 minutes, in the course of which the reaction mixture turned dark and an orange precipitate formed. This solid precipitate was filtered off with suction while hot and washed with water, ethanol, acetone, ethyl acetate and ether. The resulting product was freed of adhering solvent residues in a desiccator. (It is pure enough in this state for further reactions. If desired, it can be recrystallized from dioxane.)

Yield: 15.5 g (31% of theory), decomposition: 270° C. $C_{18}H_{18}O_6$, M=330.3

Elemental analysis: calculated C 65.45; H 5.49; found C 65.73; H 5.62.

$^1$H-NMR$_{300}$ (d$_6$-DMSO/TMS): $\delta = 1.29$ (s; 12H, Me$_2$), 7.27, 7.28 (2×s; 2×2H, 2-H, $\alpha$-H), 10.15 (bs; 2H, OH) In addition there are signals of another double bond isomer.

UV-Vis(dioxane): $\lambda_{max} = 440$, 421sh, 248 nm

IR (solid, KBr): $\tilde{\nu} = 3360$ (OH), 3095 (=C—H), 3030 (=C—H), 2990 (CH$_3$), 2940 (CH$_3$), 2870 (CH$_3$), 1675 (C=O), 1652 (C=C—C=O), 1623 cm$^{-1}$ (C=C).

EXAMPLE 4

Bis(3-acetoxy-5,5-dimethyl-4,6-dioxocyclohex-2-enylidene)ethane 2 g of bis(3-hydroxy-5,5-dimethyl-4,6-dioxocyclohex-2-enylidene)ethane (from Example 3) were dissolved in 15 ml of pyridine, and 6 ml of acetic anhydride were added. After stirring for 10 minutes a yellowish green precipitate formed, which was filtered off with suction after 1 hour and washed with ether. The crude product was recrystallized twice from chloroform, which produced a greenish yellow powder.

Yield: 1.5 g (60% of theory), melting point: 210° C. $C_{22}H_{22}O_8$, M=414.4, Elemental analysis: calculated C 63.76; H 5.35; found C 63.49; H 5.36.

$^1$H-NMR$_{300}$(CDCl$_3$/TMS): $\delta = 1.44$ (s; 12H, Me$_2$), 2.33 (s; 6H, OAc), 7.63 (s; 2H, $\alpha$-H), 7.65 (s; 2H, 2-H)

UV-Vis (CHCl$_3$): $\lambda_{max} = 388$, 250 nm

IR (solid, KBr): $\tilde{\nu} = 2980$ (=CH), 2935 (CH:), 1765 (COOAc), 1700 (C=O), 1675 (C=O), 1180 (C—O—C), 1030 cm$^{-1}$ (C—O—C)

EXAMPLE 5

Bis(3-benzoyloxy-5,5-dimethyl-4,6-dioxocyclohex-2-enylidene)ethane 8 ml of benzoyl chloride were added to a solution of 2 g of bis(3-hydroxy-5,5-dimethyl-4,6-dioxocyclohex-2-enylidene)ethane (from Example 3) in 15 ml of pyridine. There was an exothermic reaction, and a dirty yellow precipitate formed within 2 hours, which was filtered off with suction and washed with ether. The crude product was recrystallized twice from chloroform, in the form of felted yellow needles.

Yield: 1.1 g (34% of theory), melting point: 224° C. $C_{32}H_{26}O_8$, M=538.55, Elemental analysis: calculated C 71.3; H 4.8; found C 71.44; H 4.98.

$^1$H-NMR$_{300}$(CDCl$_3$/TMS): $\delta = 1,50$ (S; 12H, Me$_2$), 7.53 (tm; 4H, 3'-H, 5'-H), 7.68 (tm; 2H, 4'-H), 7.71 (s; 2H, $\alpha$-H), 7.83 (s; 2H, 2-H), 8.14 (m; 4H, 2'-H, 6'-H)

UV-Vis (CHCl$_3$) $\lambda_{max} = 392$, 285, 277 nm

IR (solid, KBr): $\tilde{\nu} = 2980$ (CH$_3$), 1735 (COOB$_2$), 1695 (C=O), 1665 (C=O), 1250 (C—O—C), 1055 cm. (C—O—C)

EXAMPLE 6

Bis(3-methoxy-5,5-dimethyl-4,6-dioxocyclohex-2-enylidene)ethane 4 g of bis(3-hydroxy-5,5-dimethyl-4,6-dioxocyclohex-2-enylidene)ethane (from Example 3) were dissolved in a mixture of 240 ml of dioxane and 240 ml of acetonitrile by refluxing under nitrogen. 16 g of dimethyl sulfate were then added, followed by 12 g of finely crushed anhydrous potassium carbonate. The batch turned greenish blue at once, but became yellow in the course of an hour of heating under reflux. The reaction mixture was filtered while still hot, the filter cake was washed with acetonitrile, and the combined organic phases were concentrated in a rotary evaporator. The residues of alkylating agent were removed by digestion with ether, and the insolubles were removed by heating in chloroform. The filtrate was concentrated and the residue was repeatedly recrystallized from acetone. This gave a solid in the form of reddish yellow prisms.

Yield: 1.4 g (32% of theory), melting point: 247° C. $C_{20}H_{22}O_6$, M=358.4

Elemental analysis: calculated C 67.03; H 6.19; found C 66.74; H 5.91.

$^1$H-NMR$_{300}$(CD$_2$Cl$_2$/TMS) $\delta$=1.38 (s; Me$_2$), 3.90 (s; 6H, OMe), 7.05, 7.48 (2×s; 2×2H, 2-H, α-H)

UV-Vis (CHCl$_3$) $\lambda_{max}$=433, 240 nm

IR (solid, KBr): $\bar{\nu}$=3060 (=CH), 2960 (CH$_3$), 2930 (CH$_3$), 2835 (OCH$_3$), 1690 (C=O), 1665 (C=O), 1595 (C=C), 1220 (=C—O—C), 1050 cm$^{-1}$ (=C—O—C)

EXAMPLE 7

Bis(5,5-dimethyl-3-trimethylsiloxy-4,6-dioxocyclohex-2-enylidene)ethane

A suspension of 1 g of bis(3-hydroxy-5,5-dimethyl-4,6-dioxocyclohex-2-enylidene)ethane (from Example 3) in 50 ml of absolute ethyl acetate was refluxed with 10 ml of hexamethyldisilazane [(Me$_3$Si)$_2$NH] with the exclusion of moisture. After heating for 40 minutes a solution formed, and the solvents were distilled off under an aspirator with interposition of a KOH-filled drying tower.

As soon as the crude product formed a crystalline precipitate in the heat, it was filtered off with suction through a hot frit and washed with plenty of cold n-hexane. Crystallization from 10 ml of absolute n-hexane per 0.1 g of crude product in the deep freeze produced the title product in the form of reddish orange crystals.

Yield: 1.1 g (74% of theory), decomposition: 170° C. $C_{24}H_{34}O_6Si_2$, M=474.7

Elemental analysis: calculated C 60.73; H 7.22; found C 60.49; H 7.30.

$^1$H-NMR$_{300}$(CDCl$_3$/TMS): $\delta$=0.30 (s; 24H, Me$_3$Si), 1.40 (s; 12H, Me$_2$), 7.33 (s; 2H, 2-H), 7.42 (s; 2H, α-H) In addition there are signals of another double bond isomer.

UV-Vis (dioxane): $\lambda_{max}$=440, 420 sh nm

IR (solution, CCl$_4$): $\nu$=2950 (CH$_3$), 1685 (C=O), 1665 (C=O), 1590 cm$^{-1}$ (C=O)

EXAMPLE 8

Bis(3-N-cyclohexylamino-5,5-dimethyl-4,6-dioxocyclohexylidene)ethane 6 g of cyclohexylamine were dissolved in 40 ml of dioxane in the presence of an amount of acetic acid sufficient to dissolve the salt intermediate. This mixture was added to a solution of 10 g of 3,3,5-trimethyl cyclohex-5-ene-1,2,4-trione (from Example 2) in 40 ml of dioxane. The mixture was left at room temperature for 45 minutes, in the course of which it turned reddish violet, and was then poured into 600 ml of water with vigorous stirring. The precipitating platelets were filtered off with suction and washed with a little methanol. The crude product was purified by recrystallizing it once from dioxane and then dried in a desiccator.

Yield: 0.6 g (4% of theory), decomposition: 250° C. $C_{30}H_{40}N_2O_4$, M=492.7

Elemental analysis: calculated C 73.14; H 8.18; N 5.69; found C 72.98; H 8.22; N 5.72.

$^1$H-NMR$_{300}$(d$_{18}$-HMPT/TMS): $\delta$=0.8-2.0 (bm; 20H, 2'-H, 3'-H, 4'-H, 5'-H, 6'-H), 1.30 (s; 12H, Me$_2$), 3.40 (bs; 2H, 1'-H), 6.52, 7.08 (2×s; 2×2H, 2-H, α-H), 10.60 (bs; 2H, NH)

In addition there are signals of further double bond isomers.

UV-Vis (dioxane): $\lambda_{max}$=536 nm

IR (solid, KBr): $\bar{\nu}$=3340 (NH), 2960 (CH$_3$), 2850 (CH$_3$), 1650 (C=O), 1580 cm$^{-1}$ (C=C)

MS (70 eV): m/e (%)=492 (100, M$^+$), 477 (11, M-Me), 462 (3, M-2 Me), 409 (16, M-C$_6$H$_{11}$), 246 (5, M/2)

EXAMPLE 9

Bis(3-anilino-5,5=dimethyl ™ 4,6-dioxocyclohex-2-enylidene)ethane 2.82 g of aniline and 5.1 g of trifluoroacetic acid were combined in 20 ml of dioxane. This mixture was added to a solution of 5 g of 3,3,5-trimethylcyclohex-5-ene-1,2,4-trione (from Example 2) in 20 ml of dioxane. The batch rapidly turned reddish violet and was poured after 90 minutes into 400 ml of water with vigorous stirring. The precipitating product was filtered off with suction, washed with ethanol and ether and recrystallized from 30 ml of boiling dioxane, giving darkish violet, metallically bright platelets.

Yield: 1.9 g (26% of theory), decomposition > 300° C. $C_{30}H_{28}N_2O_4$, M=480.6

Elemental analysis: calculated C 74.98; H 5.87 ; N 5.83; found C 75.24; H 5.65; N 5.86.

$^1$H-NMR$_{300}$(d$_{18}$-HMPT/TMS): $\delta$=1.35 (s; 12H, Me$_2$), 6.9-7.5 (m, 2-H, α-H), C$_6$H$_5$)

UV-Vis (dioxane): $\lambda_{max}$=555 nm

UV-Vis (CHCl$_3$): $\lambda_{max}$=564 nm

UV-Vis (DMF): $\lambda_{max}$=572 nm

IR (solid, KBr): $\bar{\nu}$=3320 (NH), 2980 (CH$_3$), 1680 (C=O), 1650 (C=O), 1575 cm$^{-1}$ (C=C).

The same method was used to obtain the dyes of the formula

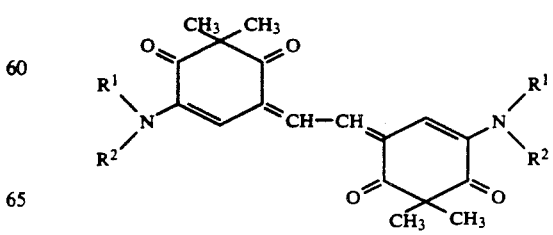

listed below in Table 1.

TABLE 1

| Example No. | R¹ | R² | Acid | $\lambda_{max}$ [nm] (CHCl₃) |
|---|---|---|---|---|
| 10 | n-C₄H₉ | H | CH₃—COOH | 540 |
| 11 | —(CH₂)₅— | | CH₃—COOH | 552 |
| 12 | p-Tolyl | H | CF₃—COOH | 570 |
| 13 | Naphth-1-yl | H | CF₃—COOH | 582 |
| 14 | CH₂—C₆H₅ | H | CF₃—COOH | 548 |
| 15 | n-C₄H₉ | CH₃ | CH₃—COOH | 542 |
| 16 | —CH₂—CH₂—O—CH₂—CH₂— | | CH₃—COOH | 550 |
| 17 | CH₂—CH₂—C₆H₅ | H | H—COOH | 550 |
| 18 | Cyclo-C₅H₉ | H | CH₃—COOCH | 540 |

EXAMPLE 19

Bis(1,1-dimethyl-2-oxo-5-phenyl-1,2,5-trihydrophenaz-3-enylidene)ethane

A solution of 3.3 g of N-phenylphenylene-1,2-diamine in 25 ml of dioxane and 5 ml of trifluoroacetic acid was added to a solution of 3 g of 3,3,5-trimethylcyclohex-5-ene-1,2,4-trione (from Example 2) in 35 ml of dioxane. The batch, which turned bluish green, was left stirring at room temperature for a further hour, in the course of which the target product already formed a substantial precipitate. After the suspension had been poured into 500 l of water with intensive stirring, the green precipitate was filtered off with suction and washed with ethanol and ether. Recrystallization from chlorobenzene gave the title product in the form of greenish, metallically bright platelets.

Yield: 4.2 g (74% of theory), melting point: >280° C.
$C_{42}H_{34}N_4O_2$, M=626.75

Elemental analysis: calculated C 80.49; H 5.47; N 8.94; found C 80.62; H 5.54; N 8.64.

UV-Vis (dioxane): $\lambda_{max}$=640, 328, 251 nm
UV-Vis (MeCONMe₂): $\lambda_{max}$=648 nm
IR (solid, KBr): $\tilde{v}$=1670 (C=O), 1540 cm⁻¹ (C=N)

The same method was used to obtain the dyes of the formula

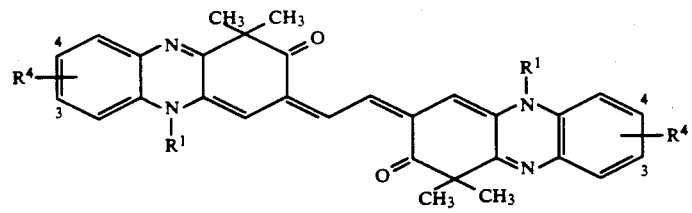

listed below in Table 2.

TABLE 2

| Example No. | R¹ | R⁴ |
|---|---|---|
| 20 | C₂H₅ | H |
| 21 | Cyclo-C₆H₁₁ | H |
| 22 | CH₂—C₆H₅ | 3-CH₃ |
| 23 | C₆H₅ | 3-CH₃O |
| 24 | Cyclo-C₆H₁₁ | 3-CH₃O |
| 25 | C₆H₅ | 3-Cl |
| 26 | C₂H₅ | 3-Cl |
| 27 | CH₂—C₆H₅ | 4-CH₃ |
| 28 | C₆H₅ | 4-CH₃O |
| 29 | cyclo-C₆H₁₁ | 4-CH₃O |
| 30 | C₆H₅ | 4-Cl |
| 31 | C₆H₅ | 4-Cl |

We claim:

1. A cycloalkylidene dye of the formula I

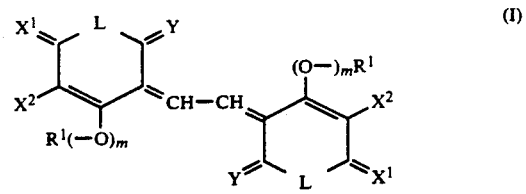

where
m is 0 or 1,
L is a chemical bond or C₁-C₂-alkylene, which may be monosubstituted or disubstituted by C₁-C₄-alkyl,
R¹ is hydrogen, C₁-C₂₀-alkyl, which may be phenyl-substituted, phenyl, phenyl substituted with C₁-C₄-alkyl, C₁-C₄-alkoxy or halogen, naphthyl or C₃-C₇-cycloalkyl,
Y is oxygen or two hydrogens,
X¹ is oxygen and
X² is C₁-C₈ alkanoyloxy, benzoyloxy, 2-methylbenzoyloxy, 2-methoxybenzoyloxy, 2-chlorobenzoyloxy, C₁-C₆-trialkylsilyloxy or a radical of the formula OR¹ or NR²R³, where R¹ is as defined above and R² and R³ are identical or different and each is independently of the other C₁-C₂₀-alkyl, which may be phenyl-substituted, phenyl, phenyl substituted with C₁-C₄-alkyl, C₁-C₄-alkoxy or halogen, naphthyl, or C₃-C₇-cyclalkyl or R² and R³ together with the nitrogen atom joining them may form pyrrolidino, piperidino, morpholino, piperazino or N-(C₁-C₄-alkyl)piperazino, or else one of R² and R³ is hydrogen, or X¹ and X² together are a radical of the formula

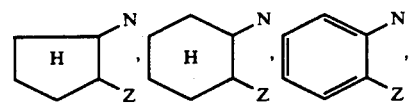

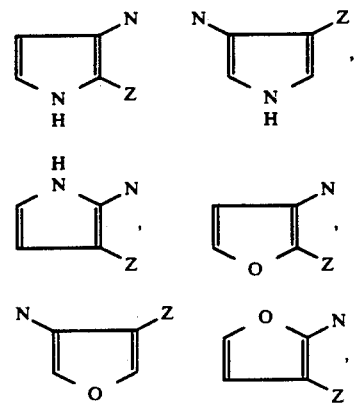

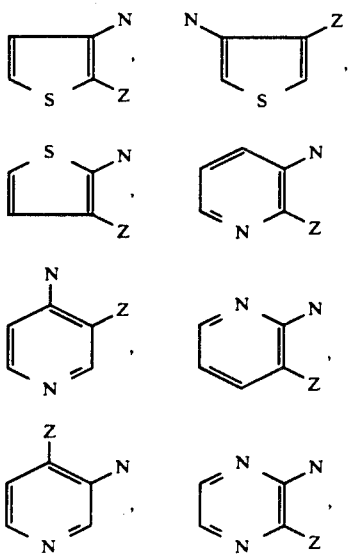

which ring systems may each additionally be monosubstituted or polysubstituted by $C_1$–$C_{10}$-alkyl, $C_1$–$C_{10}$-alkoxy, nitro, amino, $C_1$–$C_4$-monoalkylamino, $C_1$–$C_4$-dialkylamino, pyrrolidino, piperidino, morpholino, piperazino, N-($C_1$–$C_4$-alkyl) piperazino or halogen, where Z is oxygen, sulfur or $NR^2$, where $R^2$ is as defined above.

2. A cycloalkylidene dye as claimed in claim 1, wherein L is a chemical bond or 2-propylidene.

3. A cycloalkylidene dye as claimed in claim 1 of the formula II

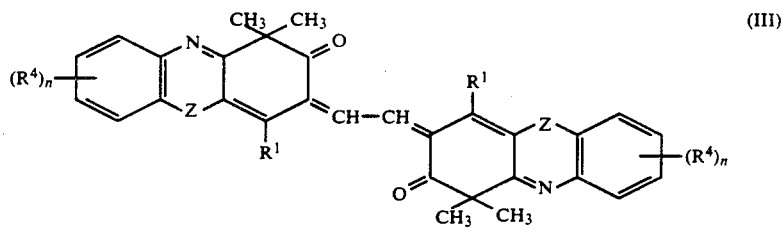

where
$R^1$ is hydrogen, $C_1$–$C_{10}$-alkyl, which may be phenyl-substituted, phenyl or naphthyl and
$X^2$ is as defined in claim 1.

4. A cycloalkylidene dye as claimed in claim 1 of the formula III

where
n is 1, 2, 3 or 4,
$R^1$ is hydrogen, $C_1$–$C_{10}$-alkyl, which may be phenyl-substituted, phenyl or naphthyl and
$R^4$ is $C_1$–$C_{10}$-alkyl, $C_1$–$C_{10}$-alkoxy, nitro, amino, $C_1$–$C_4$-monoalkylamino, $C_1$–$C_4$-dialkylamino, pyrrolidino, piperidino, morpholino, piperazino, N-($C_1$–$C_4$-alkyl)-piperazino or halogen, and
Z is as defined in claim 1.

* * * * *